United States Patent
Smith (10) Patent No.: US 10,494,119 B2
(45) Date of Patent: Dec. 3, 2019

(54) POWER DISTRIBUTION CONNECTOR WITH THERMALLY CONDUCTIVE POLYMER HEAT SINK

(71) Applicant: GE Aviation Systems Limited, Cheltenham, Gloucestershire (GB)

(72) Inventor: Michael James Smith, Chadlington (GB)

(73) Assignee: GE Aviation Systems Limited, Cheltenham (GB)

(*) Notice: Subject to any disclaimer, the term of this patent is extended or adjusted under 35 U.S.C. 154(b) by 350 days.

(21) Appl. No.: 15/378,136

(22) Filed: Dec. 14, 2016

(65) Prior Publication Data

US 2017/0166324 A1    Jun. 15, 2017

(30) Foreign Application Priority Data

Dec. 16, 2015    (GB) .................... 1522185.6

(51) Int. Cl.
*G06F 1/20*    (2006.01)
*B64D 47/00*    (2006.01)
(Continued)

(52) U.S. Cl.
CPC ............. *B64D 47/00* (2013.01); *H02B 1/20* (2013.01); *H02G 5/10* (2013.01); *H05K 7/209* (2013.01); *B64D 2221/00* (2013.01); *G06F 1/20* (2013.01); *H01L 23/367* (2013.01); *H01L 23/3672* (2013.01); *H01L 23/3677* (2013.01);
(Continued)

(58) Field of Classification Search
CPC ...... H05K 1/0201; H05K 3/0061; H05K 7/20; H05K 7/20154; H05K 1/0203; H05K 1/0209; H05K 7/20481; G06F 1/20; H01L 23/36; H01L 23/367; H01L 23/3672; H01L 23/3677; H01L 33/64; H01L 51/529; H01L 23/3733; H01L 23/3737; H01L 23/3731; F21V 29/2212; F21V 29/70; F21V 29/74;
(Continued)

(56) References Cited

U.S. PATENT DOCUMENTS 6,093,961 A    7/2000    McCullough
8,410,602 B2 *  4/2013   Natarajan ............ H01L 23/367
                                                        257/706
(Continued)

FOREIGN PATENT DOCUMENTS

EP    2280460 A1    2/2011
EP    2645486 A1 *  10/2013    .......... H01H 71/082
(Continued)

OTHER PUBLICATIONS

GB Combined Search and Exam Report issued in connection with corresponding GB Application No. 1522185.6 dated Feb. 11, 2016.

*Primary Examiner* — Abdullah A Riyami
*Assistant Examiner* — Justin M Kratt
(74) *Attorney, Agent, or Firm* — McGarry Bair PC (57) ABSTRACT

A power distribution connector is provided, which includes an electrically conductive bus bar configured to conduct electricity between a power-supplying node and an opposing power-consuming node, and has a set of surfaces between the opposing nodes and a thermally conductive polymer having a first surface abutting at least a portion of a subset of the bus bar surfaces and a second surface spaced from the first surface.

20 Claims, 5 Drawing Sheets

(51) Int. Cl.
  *H02B 1/20*   (2006.01)
  *H05K 7/20*   (2006.01)
  *H02G 5/10*   (2006.01)
  *H05K 1/02*   (2006.01)
  *H01L 23/367* (2006.01)
  *H05K 3/00*   (2006.01)
  *H01R 25/16*  (2006.01)

(52) U.S. Cl.
  CPC .......... *H01R 25/161* (2013.01); *H05K 1/0201* (2013.01); *H05K 1/0203* (2013.01); *H05K 1/0209* (2013.01); *H05K 3/0061* (2013.01); *H05K 7/20* (2013.01); *H05K 7/20154* (2013.01); *H05K 7/20481* (2013.01)

(58) Field of Classification Search
  CPC ... F21V 29/76; G02B 6/4269; G11B 33/1426; H01C 1/084; H01F 27/22
  USPC ............ 439/485, 487, 486, 196; 361/679.54, 361/696, 697, 704, 705, 713
  See application file for complete search history.

(56) References Cited

U.S. PATENT DOCUMENTS

| | | | |
|---|---|---|---|
| 8,437,118 B2* | 5/2013 | Kasza | ............... H02B 1/56 174/133 B |
| 8,445,800 B2 | 5/2013 | Mills et al. | |
| 2014/0087584 A1 | 3/2014 | Pal | |
| 2016/0037623 A1* | 2/2016 | Fjelstad | ............... H05K 1/0203 361/720 |

FOREIGN PATENT DOCUMENTS

| | | |
|---|---|---|
| EP | 2645486 A1 | 10/2013 |
| EP | 2645487 A1 | 10/2013 |
| KR | 101055657 B | 8/2011 |
| KR | 20120106665 A | 9/2012 |
| WO | 20130143657 A1 | 10/2013 |
| WO | 20140182174 A1 | 11/2014 |

* cited by examiner

POWER DISTRIBUTION CONNECTOR WITH THERMALLY CONDUCTIVE POLYMER HEAT SINK

BACKGROUND

Electrical power systems, such as those found in an aircraft power distribution system, employ power generating systems or power sources, such as generators, for generating electricity for powering the systems and subsystems of the aircraft. Electricity traverses conductive bus bars to deliver power from power sources to power distribution nodes and, ultimately, to electrical loads dispersed throughout the power system. While bus bars are typically constructed from electrically conductive materials, even a small electrical resistance of the bus bars causes Joule heating, also known as ohmic heating or resistive heating. Joule heating is a process in which the passage of current through a conductor generates heat in the conductor by way of resistive losses.

BRIEF DESCRIPTION

In one aspect, a power distribution connector includes an electrically conductive bus bar configured to conduct electricity between a power-supplying node and an power-consuming node, and having a set of surfaces between the opposing nodes, and a thermally conductive polymer having a first surface abutting at least a portion of a subset of the bus bar surfaces and a second surface spaced from the first surface, wherein the second surface includes at least one of a set of thermal fins or a set of thermal pin fins. The thermally conductive polymer is configured to remove heat generated by bus bar during a current-carrying operation by way of thermal conduction from the at least a portion of the subset of the bus bar surfaces to the first surface of the polymer and thermal radiation from the second surface of the polymer.

In another aspect, a power distribution system includes a power source, a power-consuming load spaced from the power source, a bus bar having a first contact configured to couple with the power source and a second contact configured to couple with the power-consuming load such that the bus bar electrically couples the power source with the power-consuming load, and a thermally conductive polymer located along the bus bar at least at a portion other than the first and second contacts and having at least one of a set of thermal fins or a set of pin fins, wherein the thermally conductive polymer is thermally coupled with the bus bar to define a heatsink for the bus bar.

In yet another aspect, a power distribution connector includes an electrically conductive bus bar having a power-supplying node and an opposing power-consuming node, wherein the bus bar includes a positive temperature coefficient and a cross-sectional area, wherein the bus bar is configured to conduct electricity between the power-supplying node and the power-consuming node, and a thermally conductive polymer located along the bus bar, wherein the thermally conductive polymer is thermally coupled with the bus bar to define a heatsink configured to reduce the operating temperature of the bus bar by removing heat generated by a current-carrying operation and dissipating the removed heat by way of thermal radiation. The cross-sectional area of the bus bar is reduced, compared to a bus bar without a heatsink, due to the reduced operating temperature of the bus bar.

DETAILED DESCRIPTION

The described embodiments of the present disclosure are directed to a power distribution connector and system associated with a supplying power from a power source to a power-consuming destination. One example environment where embodiments of the disclosure can be used includes, but is not limited to, a power distribution system for an aircraft. While this description is primarily directed toward a power distribution system for an aircraft, it is also applicable to any environment using a power distribution system where input power is received and distributed to one or more electrical loads by way of an power distribution connector, wherein the connector experiences Joule heating.

Figure 1:
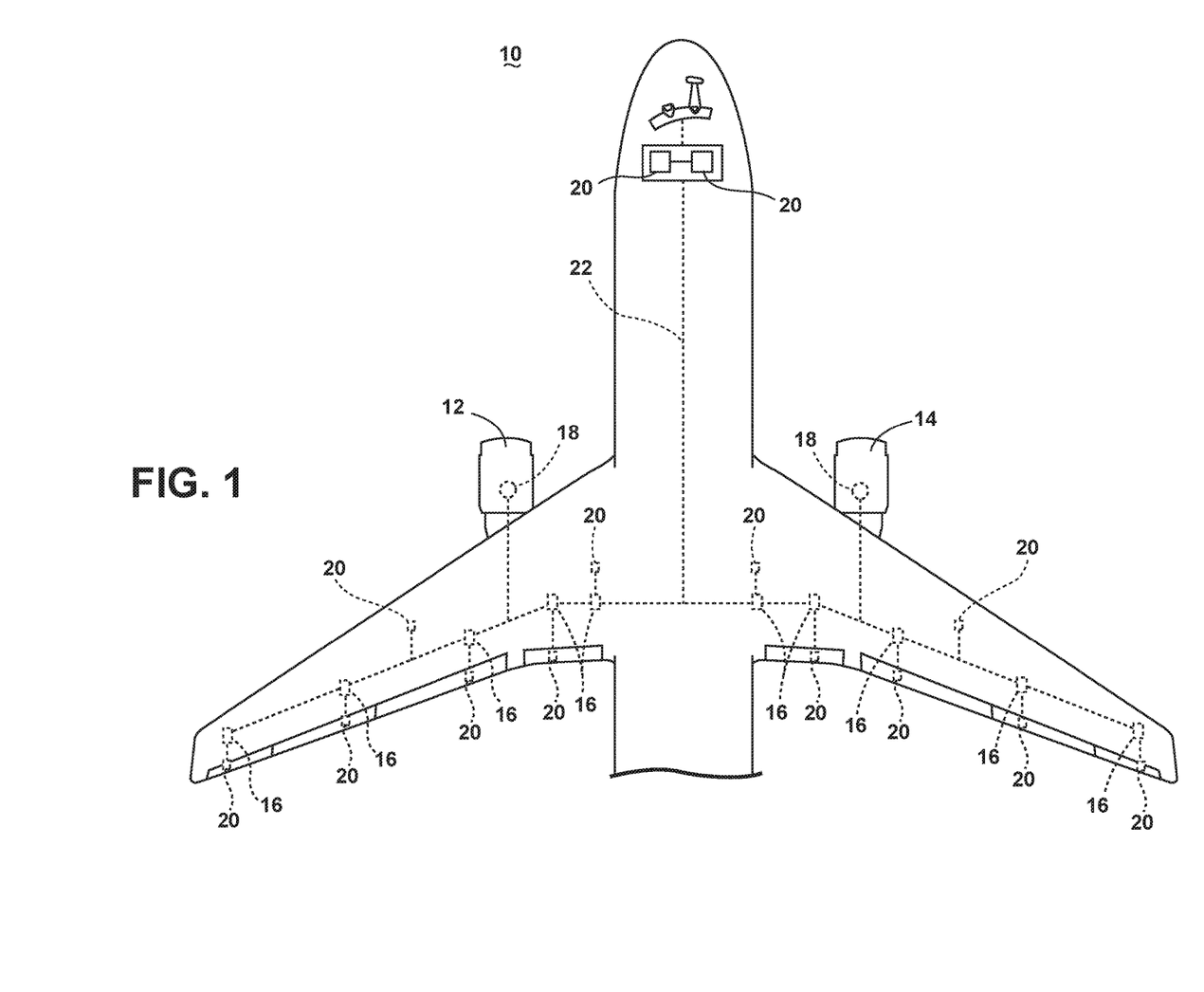
FIG. 1 is a top schematic view of an aircraft and power distribution system of the aircraft.

As illustrated in FIG. 1, an aircraft 10 is shown having at least one gas turbine engine, shown as a left engine system 12 and a right engine system 14. Alternatively, the power system can have fewer or additional engine systems. The left and right engine systems 12, 14 can be substantially identical, and can further include at least one power source or power-supplying node, such as an electric machine or a generator 18. The aircraft is shown further having a set of power-consuming components, nodes, or electrical loads 20, such as for instance, an actuator load, flight critical loads, and non-flight critical loads. The electrical loads 20 are spaced from, and electrically coupled with at least one of the generators 18 via a power distribution system including, for instance, a set of power distribution connectors, including, but not limited to transmission lines or bus bars 22, and power distribution nodes 16. As shown, the bus bars 22 can couple the generators 18 with the electrical loads 20 upstream or downstream from the power distribution nodes 16, and embodiments of the disclosure can apply to the upstream or downstream bus bars 22, as described herein.

It will be understood that the illustrated embodiment of the disclosure of FIG. 1 is only one non-limiting example of a power distribution system, and many other possible embodiments and configurations in addition to that shown are contemplated by the present disclosure. Furthermore, the number of, and placement of, the various components depicted in FIG. 1 are also non-limiting examples of embodiments associated with the disclosure.

In the aircraft 10, the operating left and right engine systems 12, 14 provide mechanical energy which can be extracted, typically via a spool, to provide a driving force for the generator 18. The generator 18, in turn, generates power, such as AC or DC power, and provides the generated power to the set of bus bars 22, which delivers the power to the power distribution nodes 16, positioned throughout the aircraft 10. The power distribution nodes 16 receive the AC or DC power via the set of bus bars 22, and can provide switching, power conversion, or distribution management functions, as needed, in order to provide the desired electrical power to the electrical loads 20 for load operations.

Additional power sources for providing power to the electrical loads 20, such as emergency power sources, ram air turbine systems, starter/generators, or batteries, can be included, and can substitute for the power source. It will be understood that while one embodiment of the disclosure is shown in an aircraft environment, the disclosure is not so limited and has general application to electrical power systems in non-aircraft applications, such as other mobile applications and non-mobile industrial, commercial, and residential applications.

Figure 2:
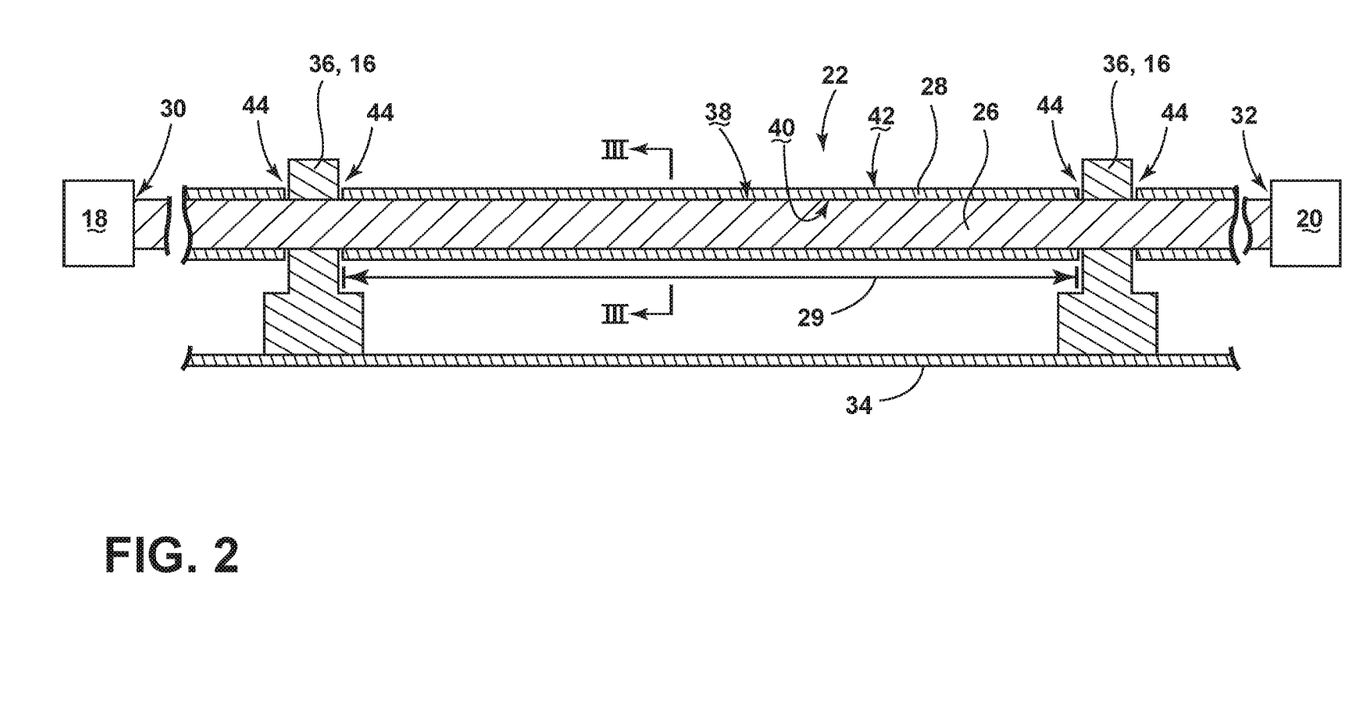
FIG. 2 is a schematic cross section of a power distribution system having a bus bar, a thermally conductive polymer, and a set of supports.

FIG. 2 illustrates a schematic view of a power distribution system 24 for an aircraft 10. As shown, the set of bus bars 22 can include an electrical conductor 26 and a thermally conductive polymer 28 extending at least a portion of a length 29 between the generator 18 and the spaced or opposing electrical load 20. Only a single generator 18, a single electrical load 20, and a single bus bar 22 are illustrated for ease of understanding. However, multiples of each are contemplated. The conductor 26 can be coupled with the generator 18 upstream from the electrical load 20 or bus bar 22 at a first contact point or node 30 and the conductor 26 can be coupled with the electrical load 20 downstream from the generator 18 or bus bar 22 at a second contact point or node 32.

Also shown, the bus bar 22 can be supported by an aircraft surface 34 such as an airframe or wall by a set of mountings 36. While mountings 36 are schematically illustrated and described, the mountings 36 can include the aforementioned power distribution nodes 16, such as contactors, to selectively provide electrical power downstream from the node 16.

The bus bar 22 or conductor 26 can include a set of surfaces 38 defining the shape and size of the bar 22, and extending between the generator 18 and electrical load 20. The thermally conductive polymer 28 can also include a first surface 40 configured to thermally abut at least a portion of at least a subset of the surfaces 38 of the conductor 26, and a second surface 42 spaced from the first surface 40. As used herein, the thermal abutting between the first surface 40 and the portion of the subset of the surfaces 38 of the conductor 26 can optionally include, for example, a paste, adhesive, tape, or otherwise binding layer having thermally conductive properties to ensure thermally conductive contact between the conductor 26 and the polymer 28. Additionally, the thermally conductive polymer 28 can be located along the bus bar 22 or conductor 26 at least at a portion other than at the first or second contacts 30, 32.

The thermally conductive polymer 28 can include a thermally conductive plastic material having a thermal conductivity greater than 0.8 Watts per milliKelvin (W/mK), and can optionally include dielectric, or electrical-insulating, materials or properties. One example thermally conductive polymer 28 material can include, but is not limited to, thermally conductive thermoplastic elastomer (TPE) or thermally conductive polypropylene. The optional dielectric material or properties can operate to electrically insulate the bus bar 22 or conductor 26 from the external environment. The thermally conductive polymer 28 can be machine or molded into forms configured to abut the at least a portion of the subset of surfaces 38 of the conductor 26.

While a single, continuous conductor 26 is shown extending between the generator 18 and the electrical load 20, embodiments of the disclosure can include a series or set of conductors 26 defining a continuous or selectively energizable electrical connection between the generator 18 and load 20. Additionally, while the thermally conductive polymer 28 is shown extending a majority of the length 29 between opposing mountings 36, and having gaps 44 exposing the conductor 26 located proximate to the mountings 36, embodiments of the disclosure can include a set of polymers 28 extending between mountings 36 wherein the set of polymers 28 can be continuous or include gaps 44.

Figure 3:
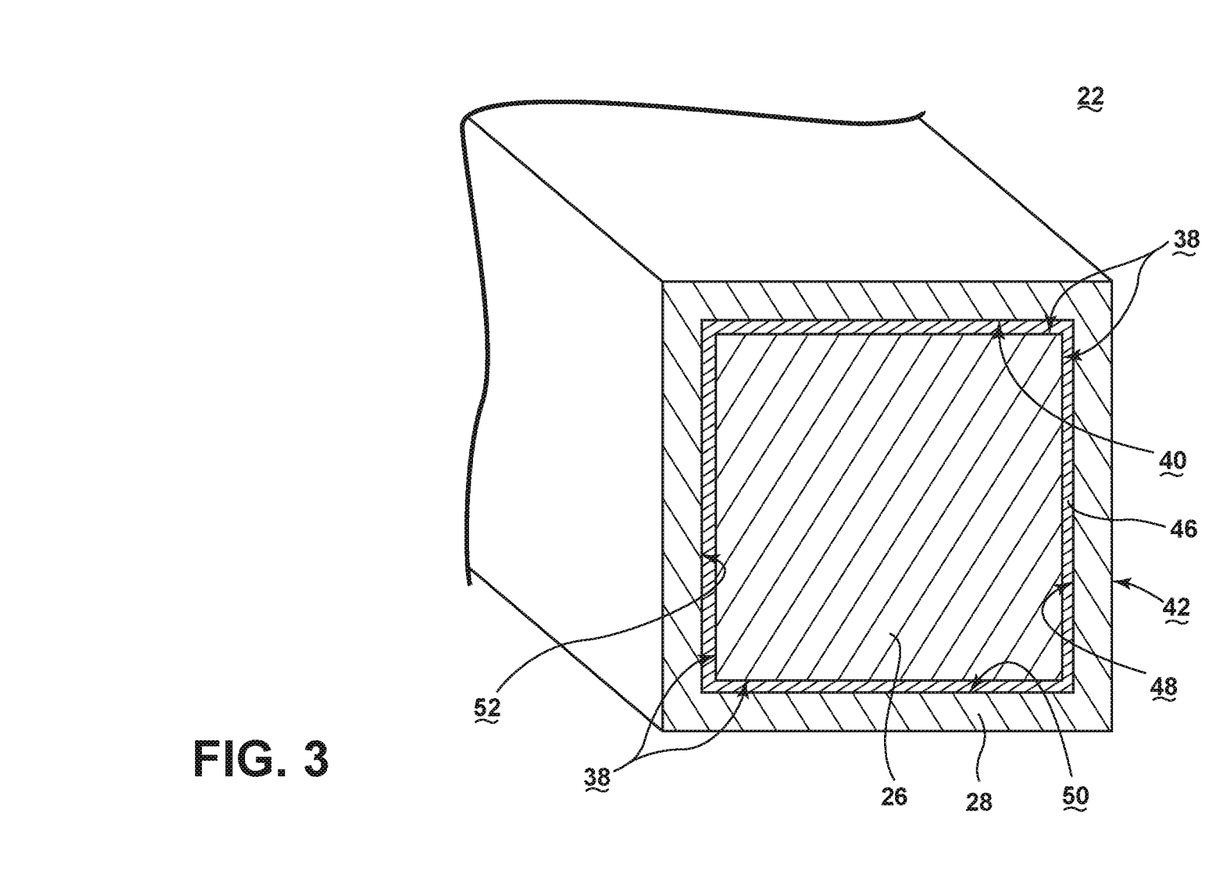
FIG. 3 is a cross-sectional view of the bus bar and thermally conductive polymer, taken along line III-III of FIG. 2.

FIG. 3 illustrates a cross section of the bus bar 22 taken along line III-III of FIG. 2, in accordance with one embodiment of the disclosure. As shown, the conductor 26 can include a substantially polygonal cross-section, illustrated as a square cross-section having a set of surfaces 38. Also shown, the conductor 26 can be enveloped by a concentric layer of the thermally conductive polymer 28. Additional polygonal cross-sections can include, but are not limited to, rectangles, triangles, pentagons, trapezoids, parallelograms, and the like. Additionally, while a substantially polygonal cross-section has been illustrated non-polygonal cross-sections are envisioned, including, but not limited to, circles, ovals, and the like. The set of surfaces 38 directly abut a thermally conductive binding layer 46, which further directly abuts the first surfaces 40 of the thermally conductive polymer 28. The thermally conductive polymer 28 is further illustrating having a third surface 48, fourth surface 50, and fifth surface 52, wherein the third, fourth, and fifth surfaces 48. 50, 52 abut a different portion of the subset of surfaces 38 of the conductor 26. In this sense, the conductor 26 is thermally coupled with the thermally conductive polymer 28 by way of a set of thermally conductive surfaces.

Embodiments of the disclosure can include configurations wherein the surface area of the second surface 42 is greater than at least a portion of the proximate or abutting set of surfaces 38 of the conductor 26. While the conductor 26 is shown thermally coupled with the thermally conductive polymer by way of a first surface 40, a third surface 48, a fourth surface 50, and a fifth surface 52, embodiments of the disclosure can include thermal coupling by way of as few as a single matching or corresponding surface 38, by ways of a majority of corresponding surfaces 38, or by way of as many surfaces 38 as the conductor 26 can correspondingly provide. While the illustrated embodiment shows that the conductor 26 can be enveloped by a concentric layer of the thermally conductive polymer 28 along the a span or length 29 of the bus bar 22, embodiments of the disclosure can include configurations wherein the conductor 26 is only partially enveloped by the thermally conductive polymer 28. For example, embodiments of the disclosure can be configured wherein only a subset of the surfaces 38 are thermally coupled with the thermally conductive polymer 28, or wherein only a portion of a span or length 29 of the bus bar 22 is partially or fully enveloped by the thermally conductive polymer 28.

During operation, the conductor 26 carries electrical current between an upstream current source, such as the generator 18, downstream to a current-consuming destination, such as the electrical load 20. In embodiments of the disclosure wherein the conductor 26 has any resistance, current-carrying operations produce resistive losses in the conductor 26, typically in the form of generating heat. In embodiments wherein the conductor 26 includes a positive temperature coefficient, that is, the electrical resistance increases with an increase in material temperature, generating heat can increase the resistive losses in the conductor 26. Stated another way, as heat is generated, the temperature of the conductor 26 increases, which can further increase the resistive losses experienced by the conductor 26 during current-carrying operations. In contrast, a decrease in temperature of the conductor 26 can reduce the resistive losses experienced by the conductor 26 during current-carrying operations.

The thermally conductive polymer 28 is configured to remove heat generated by the bus bar 22 or conductor 26 during current-carrying operations by way of thermal conduction from the at least a portion of a subset of the conductor surfaces 38 to the first surface of the polymer 28. The thermal conduction can include enhanced conduction between the conductor 26 and the thermally conductive polymer 28 by way of the optional conductive binding layer 46. The heat conducted to the thermally conductive polymer 28 can be removed from the polymer 28 by way of thermal radiation from the second surface 42 of the polymer 28. The conductive and radiative removal of heat away from the conductor 26 can lower the temperature of the conductor 26. In this sense, the thermally conductive polymer 28 can act or operate as a heatsink for dissipating heat from the bus bar 22 or conductor 26.

Embodiments of the disclosure can thus be configured to reduce the operating temperature of the bus bar 22 or conductor 26 by thermally conducting heat away from the bus bar 22 or conductor 26, by way of the thermally conductive polymer 28. Embodiments of the disclosure can reduce the operating temperature of the bus bar 22 or conductor 26 such that the cross-sectional area of the bus bar 22 or conductor 26 can be reduced, compared to a bus bar 22 or conductor 26 without a thermally conductive polymer 28, yet provide similar current-carrying characteristics or operations.

Embodiments of the disclosure are applicable for current-carrying operations of either an alternating current (AC) or direct current (DC) transmissions. In one non-limiting example, the thermally conductive polymer 28 can be configured to reduce the operating temperature of the bus bar 22 or the conductor 26 to less than 240 degrees Celsius, without deformation, melting, or failure of the polymer 28. In another non-limiting example, the thermally conductive polymer 28 can be configured to reduce the operating temperature of the bus bar 22 or the conductor 26 by at least 10 degrees Celsius, or by at least 5% of the operating temperature of the bus bar 22, without deformation, melting, or failure of the polymer 28. In yet another non-limiting example, the thermally conductive polymer 28 can be configured to reduce the operating temperature of the bus bar 22 or the conductor 26 by at least 50 degrees Celsius. Additionally layer of the bus bar 22 can be provided between the polymer 28 and the conductor 26, or external to the polymer 28. The additional layer can provide, for example, additional electrical insulating materials or properties.

Figure 4:
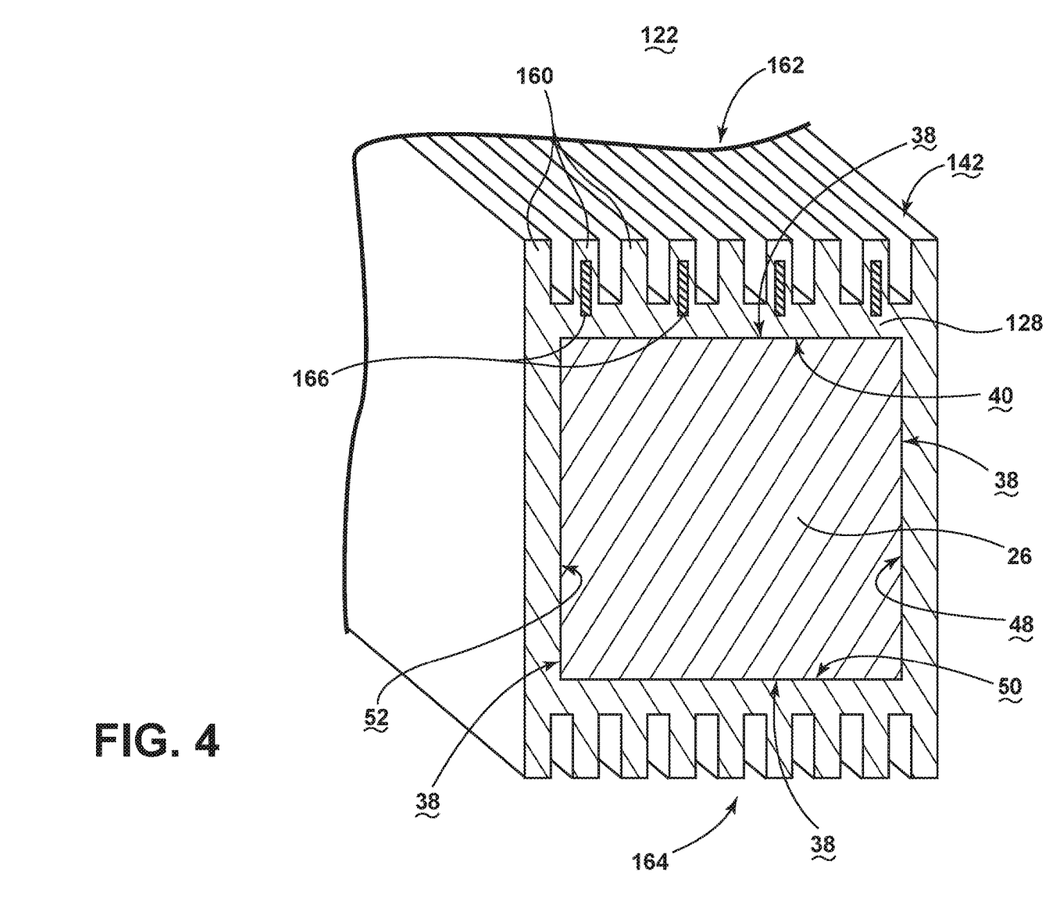
FIG. 4 is an alternative embodiment of the bus bar and thermally conductive polymer, wherein the thermally conductive polymer includes fins.

FIG. 4 illustrates an alternative bus bar 122 of the power distribution system 24 according to a second embodiment of the disclosure. The second embodiment is similar to the first embodiment; therefore, like parts will be identified with like numerals increased by 100, with it being understood that the description of the like parts of the first embodiment applies to the second embodiment, unless otherwise noted. A difference between the first embodiment and the second embodiment is that at least a portion of the second surface 142 of the thermally conductive polymer 128 includes a set of thermal fins 160 extending away from the conductor 26. The set of thermal fins 160 can be configured to increase the surface area of the second surface 142, and thus, improve the removal of heat from the bus bar 22 or conductor 26 by increasing the thermal radiation capabilities of the second surface 142.

While a "set" of thermal fins 160 is described, a "set" can include a patterned design or array of fins 160, and can extend along at least a portion of the length 29 between the generator 18 and the spaced or opposing electrical load 20. While the set of thermal fins 160 are illustrated on a respective upper portion 162 and a lower portion 164 of the thermally conductive polymer 128, embodiments of the disclosure can be configured to include a set of thermal fins 160 on additional or fewer portions of the second surface 142. Additionally, while the set of thermal fins 160 are illustrated as straight fins 160, embodiments of the disclosure can include a set or a subset of flared or angled thermal fins.

The second embodiment of the disclosure is also shown including an optional additive material 166 included with the thermally conductive polymer 128. The additive material 166 can further increase the removal of heat from the bus bar 22 or the conductor 26 by improving the coefficient of thermal conduction away from the conductor 26. In one non-limiting example of the additive material 166, carbon black, suspended metal particles, carbon strands, or a combination thereof can effectively provide for a more even or uniform dispersal of heat throughout the thermally conductive polymer 128.

In another non-limiting example of the additive material 166, a heat pipe can include a heat-transfer device that combines the principles of both thermal conductivity and phase transition to efficiently manage the transfer of heat between two solid interfaces. A thermally conductive surface or first portion of the heat pipe absorbs heat to be removed. A liquid in contact with a thermally conductive solid surface turns into a vapor by absorbing heat from that surface. The vapor then travels along the heat pipe to another thermally conductive surface or second portion of the heat pipe, remote from and cooler than the first portion. The vapor condenses back into a liquid at the second portion of the heat pipe, releasing the latent heat. The liquid then returns to the first portion of the heat pipe through, for example, capillary action, centrifugal force, or gravity, and the cycle repeats. Due to the very high heat transfer coefficients for boiling and condensation, heat pipes are highly effective thermal conductors. In this sense, the heat pipe can provide heat transfer outwardly, or normally away from the conductor 26.

While the additive material 166 is shown positioned centrally in every other thermal fin 160, embodiments of the disclosure can include alternative configurations of the additive material 166 in the thermally conductive polymer 128. For example, additive material 166 can be positioned at each thermal fin 160, at selective thermal fins 160 (e.g. only at thermal fins 160 at opposing ends of the first surface 40, at every third thermal fin 160, or the like). In another example, additive material 166 can be alternatively positioned at set, selected, or varied along the at least a portion of the length 29 between the generator 18 and the spaced or opposing electrical load 20. In yet another example, the additive material 166 can be alternatively positioned at the set of thermal fins 160, such as included with a coating applied on the second surface 142 of the thermal fins 160, as opposed to being integrated within the set of thermal fins 160.

Figure 5:
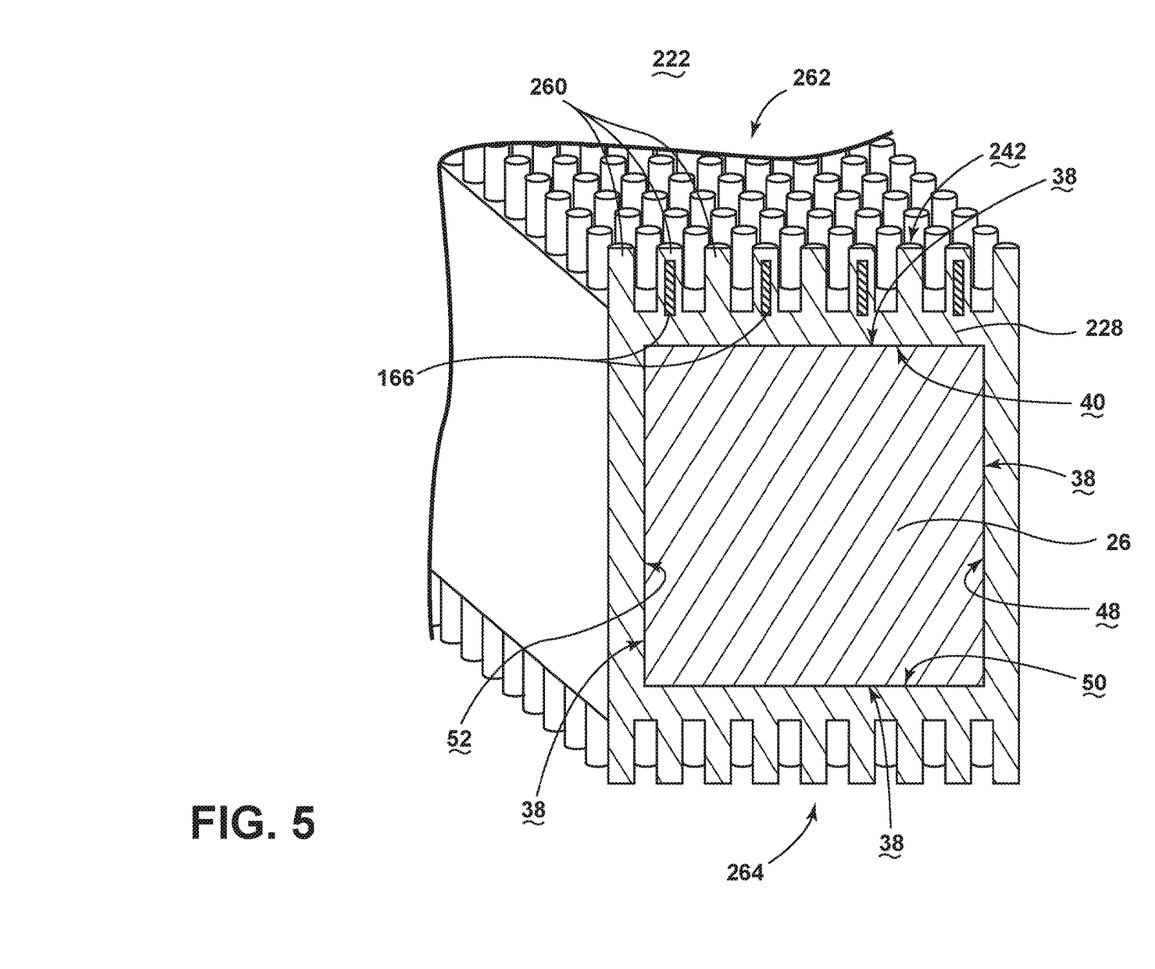
FIG. 5 is yet another alternative embodiment of the bus bar and thermally conductive polymer, wherein the thermally conductive polymer includes pin fins.

FIG. 5 illustrates another alternative bus bar 222 of the power distribution system 24 according to a third embodiment of the disclosure. The third embodiment is similar to the first and second embodiments; therefore, like parts will be identified with like numerals increased by 200, with it being understood that the description of the like parts of the prior embodiments applies to the third embodiment, unless otherwise noted. A difference between the prior embodiments and the third embodiment is that at least a portion of the second surface 242 of the thermally conductive polymer 228 includes a set of thermal pin fins 260 extending away from the conductor 26. The set of thermal pin fins 260 can be configured to increase the surface area of the second surface 242, and thus, improve the removal of heat from the bus bar 22 or conductor 26 by increasing the thermal radiation capabilities of the second surface 242.

While a "set" of thermal pin fins 260 is described, a "set" can include a patterned design or array of pin fins 260, and can extend along at least a portion of the length 29 between the generator 18 and the spaced or opposing electrical load 20. While the set of thermal pin fins 260 are illustrated on a respective upper portion 262 and a lower portion 264 of the thermally conductive polymer 228, embodiments of the disclosure can be configured to include a set of thermal pin fins 260 on additional or fewer portions of the second surface 242.

Additionally, the set of pin fins 260 can be configured to include the additive material 166 described in the second embodiment. While the additive material 166 is shown positioned centrally in every other thermal pin fin 260, embodiments of the disclosure can include alternative configurations of the additive material 166 in the thermally conductive polymer 228. For example, additive material 166 can be positioned at each thermal pin fin 260, at selective thermal pin fins 260 (e.g. only at thermal pin fins 260 at opposing ends of the first surface 40, at every third thermal pin fin 160, varied along a portion of the length 29, included as a coating applied to the second surface 242, or the like).

Many other possible embodiments and configurations in addition to that shown in the above figures are contemplated by the present disclosure. For example, the second surface 42 of the thermally conductive polymer 28 can be configured to include a surface finish having a greater emissivity, compared with an unfinished surface. Additionally, embodiment of the disclosure can include a thermally conductive polymer 28 have additional or alternative second surface 42 configurations to, for example, provide more or less surface area. Yet another embodiment of the disclosure can include a thermally conductive polymer 28 corresponding with, or tailored to a particular the operating environment of the bus bar 22, such as in a compartment or passageway with limited space. While a set of various components is described herein, it will be understood that "a set" can include any number of the respectively described elements, including only one element. Additionally, the design and placement of the various components can be rearranged such that a number of different in-line configurations could be realized.

The embodiments disclosed herein provide a power distribution system having a bus bar connector with a thermally conductive polymer for dissipating heat. The above described embodiments provide increased current-carrying capability for the conductor due to reduced operating temperatures, as well as an increase in the maximum ambient temperature limit for the bus bar. Additionally, the thermally conductive polymer can be utilized to reduce the weight and volume of the power distribution system compared to a system that used heatsinks having larger mass or weight, such as metal heatsinks. With the expansive use of bus bars for aircraft power distribution networks, the reduced mass can result in significant weight savings. Lower weight may include a competitive advantage in flight operations.

According to the above-described embodiments, the dissipation of heat from a positive temperature coefficient conductor or bus bar can result in employing a conductor with a smaller cross-sectional area, while providing the same characteristic or quality of power transmission from the power source to the power-consuming destination. Additionally manufacturing and material costs for a thermally conductive polymer can be lower compared with alternative heatsink configurations.

Embodiments of the disclosure can also enable re-locating a set of bus bars from a cavity, container, or otherwise typical routing of an aircraft to an "exposed" position in the aircraft, due to the improved thermal management and electrical isolating configuration of the thermally conductive polymer.

To the extent not already described, the different features and structures of the various embodiments can be used in combination with each other as desired. That one feature cannot be illustrated in all of the embodiments is not meant to be construed that it cannot be, but is done for brevity of description. Thus, the various features of the different embodiments can be mixed and matched as desired to form new embodiments, whether or not the new embodiments are expressly described. All combinations or permutations of features described herein are covered by this disclosure.

This written description uses examples to disclose the embodiments, including the best mode, and also to enable any person skilled in the art to practice the embodiments of the disclosure, including making and using any devices or systems and performing any incorporated methods. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A power distribution connector, comprising:
    an electrically conductive bus bar having a conductor configured to conduct electricity between a power-supplying node and a power-consuming node, and having a set of surfaces between the opposing nodes; and
    a thermally conductive polymer at least partially enveloping the conductor and having an inner surface abutting at least a portion of a subset of the conductor surfaces and an outer surface spaced from the inner surface;
    wherein, the outer surface includes at least one of a set of thermal fins or a set of thermal pin fins;
    wherein the thermally conductive polymer is configured for (i) removal of heat generated by the bus bar during a current-carrying operation by way of thermal conduction from the at least a portion of the subset of the conductor surfaces to the inner surface of the polymer and (ii) thermal radiation from the outer surface of the polymer.

2. The power distribution connector of claim 1, wherein the surface area of the second surface of the thermally conductive polymer is greater than the at least a portion of the subset of the bus bar surfaces.

3. The power distribution connector of claim 1, wherein the thermal fins include at least one of straight thermal fins or flared thermal fins.

4. The power distribution connector of claim 1, wherein the thermally conductive polymer has a thermal conductivity greater than 0.8 Watts per milliKelvin.

5. The power distribution connector of claim 1, wherein the thermally conductive polymer is configured to reduce the operating temperature of the bus bar compared to a bus bar without a thermally conductive polymer.

6. The power distribution connector of claim 5, wherein the thermally conductive polymer is configured to reduce the operating temperature by at least 10 degrees Celsius.

7. The power distribution connector of claim 5, wherein the thermally conductive polymer is configured to reduce the operating temperature by at least 5%.

8. The power distribution connector of claim 1, wherein the thermally conductive polymer includes a third surface abutting at least a different portion of a subset of the conductor surfaces than the inner surface.

9. The power distribution connector of claim 8, wherein the thermally conductive polymer envelops at least a concentric portion of the set of surfaces of the conductor.

10. The power distribution connector of claim 9, wherein the thermally conductive polymer abuts a majority of the set of surfaces.

11. The power distribution connector of claim 1, wherein the thermally conductive polymer includes at least one of carbon black, suspended metal particles, or carbon strands.

12. The power distribution connector of claim 1, wherein the thermally conductive polymer includes a dielectric material.

13. The power distribution connector of claim 1, wherein the thermally conductive polymer includes additive material.

14. A power distribution system, comprising:
a power source;
a power-consuming load spaced from the power source;
a bus bar comprising a conductor and having a first contact configured to couple with the power source and a second contact configured to couple with the power-consuming load such that the bus bar electrically couples the power source with the power-consuming load; and
a thermally conductive polymer located along the bus bar at a portion other than the first and second contacts and having at least one of a set of thermal fins or a set of pin fins on an outer surface of the thermally conductive polymer; wherein the thermally conductive polymer is thermally coupled with the bus bar to define a heatsink for the bus bar;
wherein the conductor is at least partially enveloped by the polymer and includes a set of surfaces between the power source and the power-consuming load, at least a portion of the surfaces being abutted by an inner surface of the polymer; and
wherein, the heatsink removes the heat through (i) thermal conduction from the at least a portion of a subset of the conductor surfaces to an inner surface of the polymer and (ii) thermal radiation from the outer surface of the polymer via the set of thermal fins or the set of pin fins.

15. The power distribution system of claim 14, wherein the thermally conductive polymer envelops at least a concentric portion of the bus bar between the first contact and the second contact.

16. The power distribution system of claim 14, wherein the thermally conductive polymer is configured to reduce the operating temperature by at least 50 degrees Celsius.

17. A power distribution connector, comprising:
an electrically conductive bus bar comprising:
(i) a positive temperature coefficient and a cross-sectional area;
(ii) a power-supplying node and an opposing power-consuming node, the bus bar being configured to conduct electricity between the power-supplying node and the power-consuming node; and
(iii) a conductor having a set of surfaces between the power-supplying node and the power-consuming node; and
and
a thermally conductive polymer at least partially enveloping the conductor and including an inner surface abutting at least a portion of a subset of the conductor surfaces and an outer surface spaced from the first surface;
wherein, the polymer is located along, and thermally coupled with the bus bar, to define a heatsink configured to reduce the operating temperature of the bus bar by removing heat generated by a current-carrying operation and dissipating the removed heat by way of thermal radiation;
wherein, the heatsink removes the heat through (i) thermal conduction from the at least a portion of the subset of the conductor surfaces to an inner surface of the polymer and (ii) thermal radiation from the outer surface of the polymer; and
wherein, the bus bar has a smaller cross-sectional area compared to a bus bar without a heatsink, due to the reduced operating temperature of the bus bar.

18. The power distribution connector of claim 17, wherein the thermally conductive polymer envelops at least a concentric portion of the bus bar between the power-supplying node and the power-consuming node.

19. The power distribution connector of claim 17, wherein the thermally conductive polymer includes at least one of a set of thermal fins or a set of thermal pin fins.

20. The power distribution connector of claim 17, wherein the thermally conductive polymer envelops at least a concentric portion of the bus bar.

* * * * *